(12) United States Patent
Kojima et al.

(10) Patent No.: US 11,362,225 B2
(45) Date of Patent: Jun. 14, 2022

(54) CONNECTION MEMBER SET FOR SOLAR BATTERY CELL, AND SOLAR CELL STRING AND SOLAR CELL MODULE USING SAME

(71) Applicant: KANEKA CORPORATION, Osaka (JP)

(72) Inventors: Kohei Kojima, Settsu (JP); Toru Terashita, Settsu (JP); Gensuke Koizumi, Settsu (JP)

(73) Assignee: KANEKA CORPORATION, Osaka (JP)

( * ) Notice: Subject to any disclaimer, the term of this patent is extended or adjusted under 35 U.S.C. 154(b) by 50 days.

(21) Appl. No.: 16/935,126

(22) Filed: Jul. 21, 2020

(65) Prior Publication Data

US 2020/0350450 A1 Nov. 5, 2020

Related U.S. Application Data

(63) Continuation of application No. PCT/JP2018/048032, filed on Dec. 27, 2018.

(30) Foreign Application Priority Data

Jan. 24, 2018 (JP) ................................ 2018-009997

(51) Int. Cl.
*H01L 31/05* (2014.01)
*H01L 31/054* (2014.01)
(Continued)

(52) U.S. Cl.
CPC ...... *H01L 31/05* (2013.01); *H01L 31/022425* (2013.01); *H01L 31/054* (2014.12); *H02S 40/20* (2014.12); *H02S 40/36* (2014.12)

(58) Field of Classification Search
CPC ... H01L 31/054; H01L 31/05; H01L 31/0456; H01L 31/0504; H01L 31/0508;
(Continued)

(56) References Cited

U.S. PATENT DOCUMENTS

2011/0277817 A1 11/2011 Ide et al.
2014/0124013 A1 5/2014 Morad et al.
(Continued)

FOREIGN PATENT DOCUMENTS

CN 102412317 A 4/2012
JP H11-040221 A 2/1999
(Continued)

OTHER PUBLICATIONS

International Search Report issued in PCT/JP2018/048032; dated Mar. 26, 2019.

*Primary Examiner* — Daniel P Malley, Jr.
(74) *Attorney, Agent, or Firm* — Studebaker & Brackett PC

(57) ABSTRACT

A connecting member set includes a first connecting member connected to one of a pair of solar cells, and a second connecting member connected to the other solar cell. The first connecting member and the second connecting member have a first planar portion and a second planar portion, respectively. The first planar portion and the second planar portion are layered on each other and electrically connected with each other. The first planar portion has at least one of a cut-out portion or an opening through which the second planar portion is exposed toward the first planar portion when the first planar portion and the second planar portion are layered on each other.

14 Claims, 13 Drawing Sheets

(51) Int. Cl.
*H02S 40/20* (2014.01)
*H02S 40/36* (2014.01)
*H01L 31/0224* (2006.01)

(58) Field of Classification Search
CPC ............. H01L 31/0516; H01L 31/0463; H01L 31/0465; H01L 31/0224; H01L 31/022441
See application file for complete search history.

(56) References Cited

U.S. PATENT DOCUMENTS

| | | | | |
|---|---|---|---|---|
| 2014/0124014 | A1* | 5/2014 | Morad | H01L 31/028 136/246 |
| 2014/0190546 | A1* | 7/2014 | Fukumochi | H01L 31/042 438/4 |
| 2015/0228831 | A1 | 8/2015 | Rostan et al. | |
| 2016/0093757 | A1* | 3/2016 | Pass | H01L 31/0508 136/244 |
| 2016/0141435 | A1* | 5/2016 | Sridhara | H02J 3/466 136/244 |
| 2016/0268466 | A1* | 9/2016 | Ogawa | H01L 31/0504 |
| 2017/0085217 | A1 | 3/2017 | Morad et al. | |
| 2018/0212073 | A1* | 7/2018 | Zhang | H01L 24/90 |
| 2018/0367095 | A1 | 12/2018 | Morad et al. | |
| 2020/0058815 | A1 | 2/2020 | Rostan et al. | |

FOREIGN PATENT DOCUMENTS

| | | |
|---|---|---|
| JP | 2011-077103 A | 4/2011 |
| JP | 2012-049390 A | 3/2012 |
| JP | 2012-182408 A | 9/2012 |
| JP | 2012-234735 A | 11/2012 |
| JP | 2015-527752 A | 9/2015 |
| JP | 2015-534288 A | 11/2015 |
| JP | 2018-163988 A | 10/2018 |
| KR | 10-1816164 B1 | 1/2018 |
| WO | 2010/021204 A1 | 2/2010 |
| WO | 2013/031384 A1 | 3/2013 |

* cited by examiner

CONNECTION MEMBER SET FOR SOLAR BATTERY CELL, AND SOLAR CELL STRING AND SOLAR CELL MODULE USING SAME

CROSS-REFERENCE TO RELATED APPLICATION

This is a continuation of International Application No. PCT/JP2018/048032 filed on Dec. 27, 2018, which claims priority to Japanese Patent Application No. 2018-009997 filed on Jan. 24, 2018. The entire disclosures of these applications are incorporated by reference herein.

BACKGROUND

The present invention relates to a connecting member set for solar cells, and to a solar cell string and a solar cell module using the same.

A solar cell module includes a solar cell string having a plurality of solar cells electrically connected to each other. Further, it is known to electrically connect electrodes of the solar cells in the solar cell string by a metal connecting member (e.g., Japanese Translation of PCT International Application Publication No. 2015-534288 and Japanese Patent Publication No. 2011-77103).

SUMMARY

An aspect of the present invention is a connecting member set for electrically connecting a pair of solar cells each having a first electrode and a second electrode on one of major surfaces of the solar cell, the first electrode being one of an n-type electrode or a p-type electrode, the second electrode being the other one of the n-type electrode or the p-type electrode, the connecting member set including: a first connecting member having a first electrode connecting portion that is electrically connected to the first electrode of one of the pair of solar cells; and a second connecting member having a second electrode connecting portion that is electrically connected to the second electrode of the other of the pair of solar cells, wherein the first connecting member and the second connecting member have a first planar portion and a second planar portion, respectively, the first planar portion and the second planar portion are layered on each other and electrically connected with each other, the first planar portion of the first connecting member has at least one of a cut-out portion or an opening through which the second planar portion of the second connecting member is exposed toward the first planar portion when the first planar portion and the second planar portion are layered on each other.

Another aspect of the present invention is a solar cell string having a plurality of solar cells electrically connected and linked one after another by using the connecting member set of the above aspect of the present invention, wherein each of the plurality of solar cells has, on one of major surfaces of the solar cell, a first electrode and a second electrode, the first electrode being one of an n-type electrode or a p-type electrode, and the second electrode being the other one of the n-type electrode or the p-type electrode, in a given pair of solar cells adjacent to each other out of the plurality of solar cells, the first electrode connecting portion of the first connecting member included in the connecting member set is electrically connected to the first electrode of one of the pair of solar cells, and the second electrode connecting portion of the second connecting member is electrically connected to the second electrode of the other one of the pair of solar cells, and the first planar portion of the first connecting member and the second planar portion of the second connecting member are layered on each other and electrically connected with each other, and the first planar portion and the second planar portion are adhered to each other with an adhesive applied between an edge of the at least one of the cut-out portion or the opening formed in the first planar portion and the second planar portion exposed toward the first planar portion from the at least one of the cut-out portion or the opening.

Another aspect of the present invention is a solar cell module including the solar cell string of the above aspect of the present invention.

DETAILED DESCRIPTION

The following describes in detail embodiments.

Figure 1A:
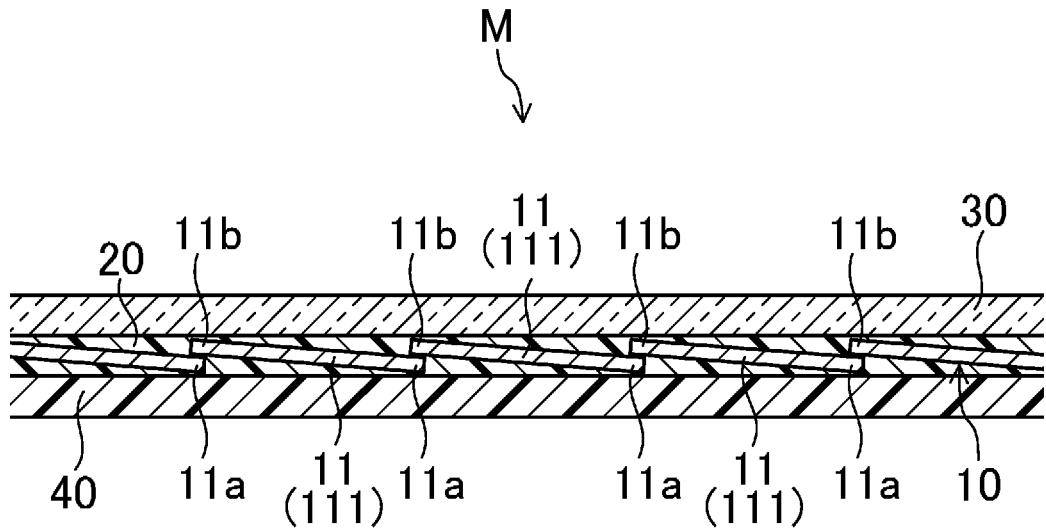
FIG. 1A is a cross-sectional view of a portion of a solar cell module according to an embodiment.
Figure 1B:
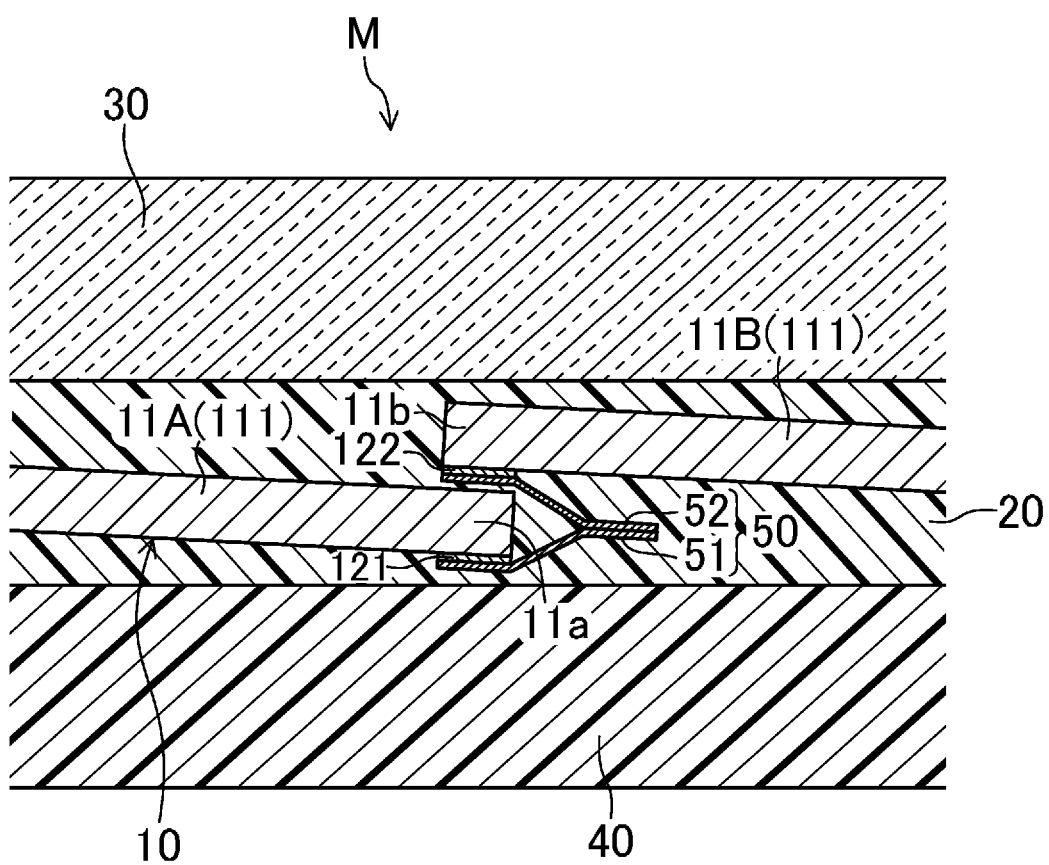
FIG. 1B is an enlarged cross-sectional view of a main part of the solar cell module according to the embodiment.

FIG. 1A and FIG. 1B illustrate a solar cell module M according to an embodiment.

The solar cell module M according to the embodiment includes: a solar cell string 10; an encapsulant layer 20 in which the solar cell string 10 is embedded in its intermediate portion relative to the thickness direction; a light receiving surface side protective member 30 stacked on a light receiving surface side of the encapsulant layer 20; and a back surface side protective member 40 stacked on the back surface side of the encapsulant layer 20.

The solar cell string 10 has a plurality of solar cells 11 connected and linked one after another electrically and mechanically. In other words, a plurality of solar cells 11 are in a series in appearance, and if the solar cells 11 are electrically connected to one another, this series of the solar cells 11 are referred to as a solar cell string 10.

Each of the plurality of solar cells 11 includes a semiconductor substrate 111 that serves as a cell body. On one of two major surfaces of the semiconductor substrate 111, an n-type semiconductor layer and a p-type semiconductor layer (not shown) are stacked. Of the two major surfaces of the semiconductor substrate 111, a major surface (also referred to as a major surface of the solar cell 11) on the side proactively receiving light (light-receiving side) is referred to as a light receiving surface, and a major surface on an opposite side (back side) with respect to the light receiving surface is referred to as a back surface.

Each solar cell 11 has, on its back surface (one of the two major surfaces), a first electrode 121 that is one of an n-type electrode electrically connected to the n-type semiconductor layer or a p-type electrode electrically connected to the p-type semiconductor layer, and a second electrode 122 that is the other one of the n-type electrode or the p-type electrode. Such a solar cell 11 is referred to as a back-electrode type (back-contact type), and the first electrode 121 and the second electrode 122 collect carriers such as positive holes or electrons.

The first electrode 121 and the second electrode 122 are a metal electrode in one preferred embodiment. However, this is a non-limiting example. A transparent conductive layer such as a metal oxide may be arranged between the first electrode 121 and the semiconductor layer underlying the first electrode 121 and between the second electrode 122 and the semiconductor layer underlying the second electrode 122. The first electrode 121 and the second electrode 122, which are each a metal electrode, are formed by a well-known method such as printing or plating. Specifically, for example, an Ag electrode is formed by screen printing using an Ag paste, and a copper-plated electrode is formed by electrolytic plating.

In one preferred embodiment, the plurality of solar cells 11 have an uneven structure formed on their light receiving surfaces to take in a large amount of light and enhance their conversion efficiency. In one preferred embodiment, the uneven structure is an aggregate of quadrangular pyramid shapes (pyramid shapes). The uneven structure with the pyramid shapes can be formed by, for example, subjecting the surface of the semiconductor substrate 111 to an anisotropic etching treatment. The unevenness of the uneven structure has a height of, for example, 0.5 μm or more and 10 μm or less, and preferably 1 μm or more and 5 μm or less. Note that the uneven structure may also be formed on the back surfaces of the solar cells 11.

Each of the plurality of solar cells 11 has a first end 11a and a second end 11b arranged so as to extend in parallel. A given pair of solar cells 11 (one of which is a solar cell 11A and the other is a solar cell 11B) adjacent to each other out of the plurality of solar cells 11 are electrically and mechanically connected to each other by placing, so as to overlap with the light receiving surface side of the first end 11a of the solar cell 11A, the second end 11b of the solar cell 11B. As described above, since the solar cells 11 are arranged and connected to each other as shingling on a roof, such connection is referred to as a shingling connection. An overlapping width of the first end 11a of the one solar cell 11A and the second end 11b of the other solar cell 11B is, for example, 0.5 mm or more and 3.0 mm or less.

Figure 2:
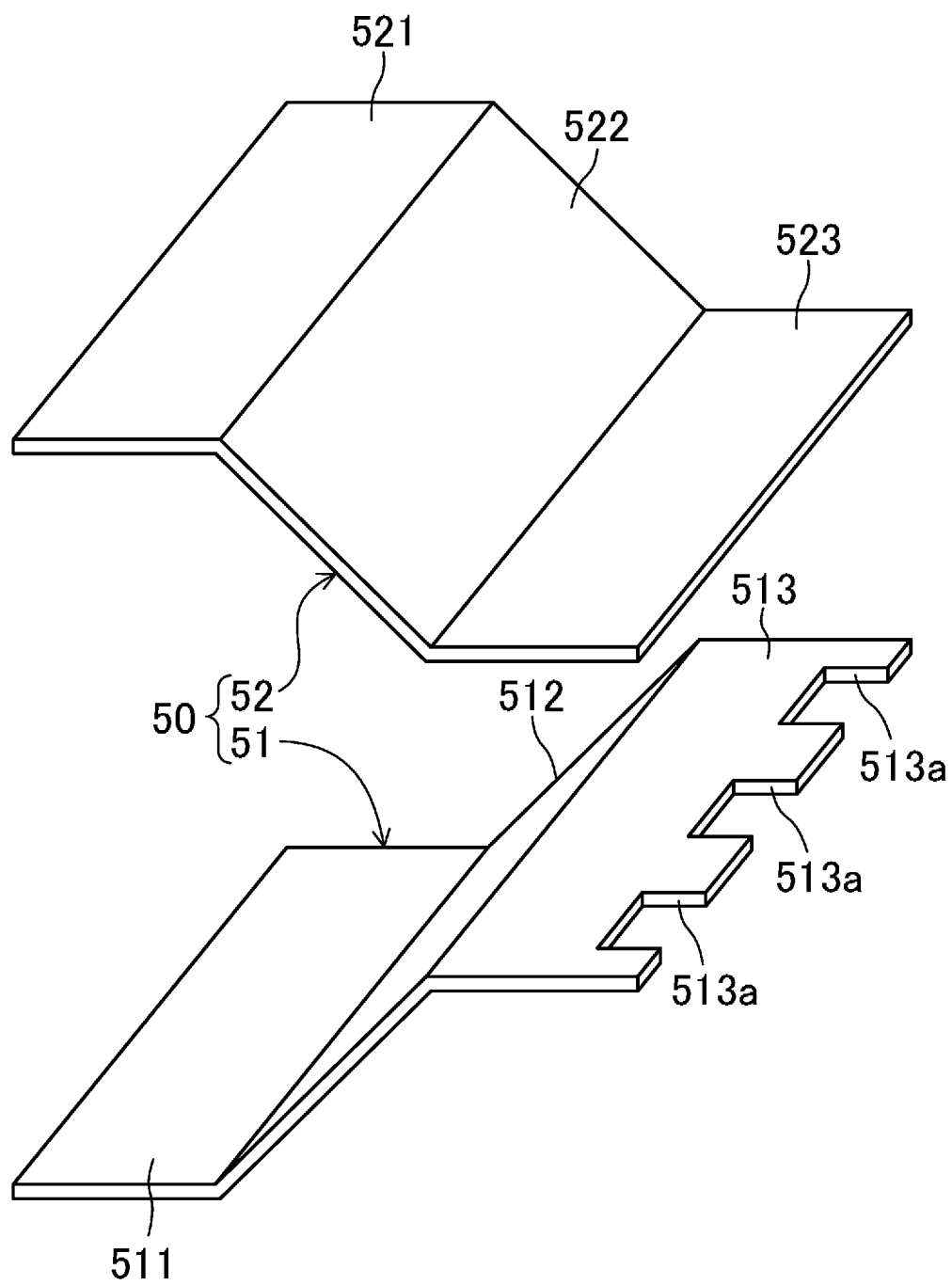
FIG. 2 is a perspective view of a connecting member set.

The given pair of solar cells 11A and 11B adjacent to each other are electrically connected through a connecting member set 50 for the solar cells 11. FIG. 2 shows an example of a connecting member set 50 for the solar cells 11.

This connecting member set 50 includes a first connecting member 51 and a second connecting member 52 both of which are made of a metal. Examples of the metal material for forming the first connecting member 51 and the second connecting member 52 include copper, aluminum, silver, gold, and alloys containing these metals. Further, the first connecting member 51 and the second connecting member 52 may have their respective surfaces coated with a conductive layer such as gold, silver, tin, or a solder, the surfaces being made of, for example, copper, aluminum, silver, gold, or an alloy containing these metals.

The first connecting member 51 is, for example, a bent product of a metal foil having a thickness of 10 μm or more and 100 μm or less. In one preferred embodiment, the metal material for forming the metal foil is copper or a copper alloy containing copper as a main component, or aluminum or an aluminum alloy containing aluminum as a main component, for the sake of lower costs. The metal foil forming the first connecting member 51 may be plated with solder, tin, or silver, or may be coated with a conductive paste or a conductive adhesive.

The first connecting member 51 includes a first electrode connecting portion 511 of the first end side, an intermediate first link 512, and a first planar portion 513 of the second end side, which are each formed in a plane shape. The first electrode connecting portion 511 of the first connecting member 51 is electrically connected to the first electrode 121 arranged on the back surface of the one solar cell 11A via a conductive adhesive, and the first link 512 and the first planar portion 513 are arranged outward of the one solar cell 11A, when viewing the back surface of the solar cell 11A from the front. That is, the first connecting member 51 is designed so that the first link 512 and the first planar portion 513 are arranged so as not to overlap the one solar cell 11A. Examples of the conductive adhesive include solder, a paste containing solder particles, a conductive paste containing metal particles, and the like (the same applies to the following description).

The first link 512 arranged outward of the one solar cell 11A is continuous to the first electrode connecting portion 511 electrically connected to the first electrode 121 of the one solar cell 11A, bent toward the light receiving surface side of the one solar cell 11A, and extends to a position approximately half of the cell thickness in the oblique outward direction. The first planar portion 513 is continuous to the first link 512, bent toward the back surface side of the one solar cell 11A, and extends in parallel with the one solar cell 11A and the first electrode connecting portion 511. Thus, the first connecting member 51 is formed so as to have a level difference between the first planar portion 513 and the first electrode connecting portion 511 in a thickness direction of the one solar cell 11A. On a side of the first planar portion 513 opposite to the side toward the first link 512, angular C-shaped cut-out portions 513a are opened along the side, apart from one another. Since the first planar portion 513 is made of a metal foil formed in a planar shape, the cut-out portions 513a can be easily formed.

The second connecting member 52 is, for example, a bent product of a metal foil having a thickness of 10 μm or more and 100 μm or less. The metal material that forms the metal foil may be the same material that forms the first connecting member 51, and may be plated or coated.

The second connecting member 52 includes a second electrode connecting portion 521 of the first end side, an intermediate second link 522, and a second planar portion 523 of the second end side, which are each formed in a plane shape. The second electrode connecting portion 521 of the second connecting member 52 is electrically connected to the second electrode 122 arranged on the back surface of the other solar cell 11B via a conductive adhesive, and the second link 522 and the second planar portion 523 are arranged inward of the other solar cell 11B, when viewing the back surface of the solar cell 11B from the front. That is, the second connecting member 52 is designed so that the second link 522 and the second planar portion 523 are arranged to overlap the other solar cell 11B.

The second link 522 arranged inward of the other solar cell 11B is continuous to the second electrode connecting portion 521 electrically connected to the second electrode 122 of the other solar cell 11B, bent away from the other solar cell 11B, and extends in the oblique inward direction so that a distance from the other solar cell 11B is approximately half of the cell thickness. The second planar portion 523 is continuous to the second link 522, bent toward the other solar cell 11B, and extends in parallel with the other solar cell 11B and the second electrode connecting portion 521. Thus, the second connecting member 52 is formed so as to have a level difference between the second planar portion 523 and the second electrode connecting portion 521 in a thickness direction of the other solar cell 11B. Further, the second planar portion 523 does not have cut-out portions 513a such as those formed on the first planar portion 513 of the first connecting member 51. Therefore, the first connecting member 51 and the second connecting member 52 are formed in different shapes, and therefore, they are easily distinguishable from each other.

Figure 3A:
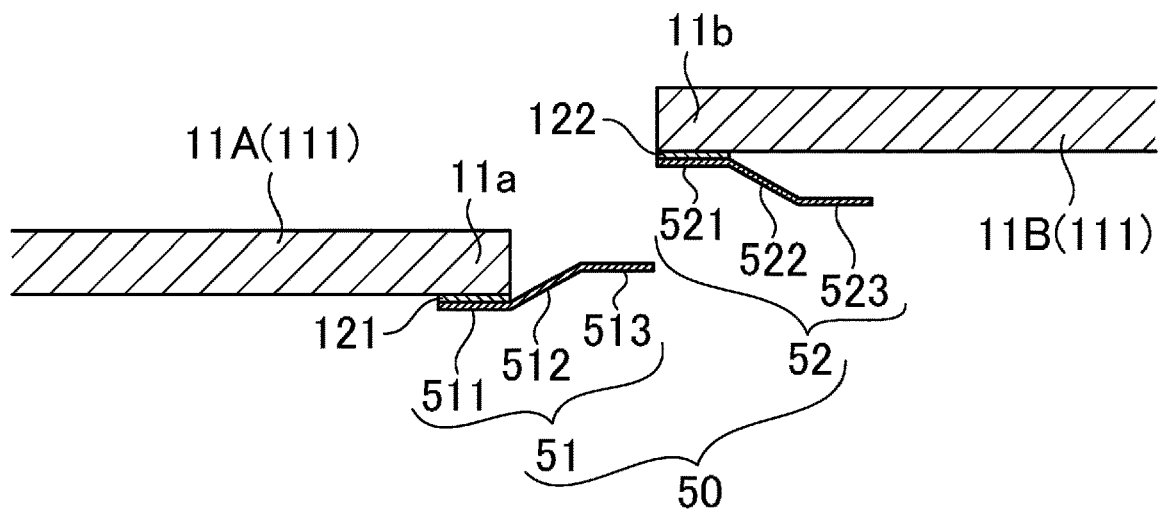
FIG. 3A is a first explanatory diagram illustrating a connection method of solar cells using the connecting member set.
Figure 3B:
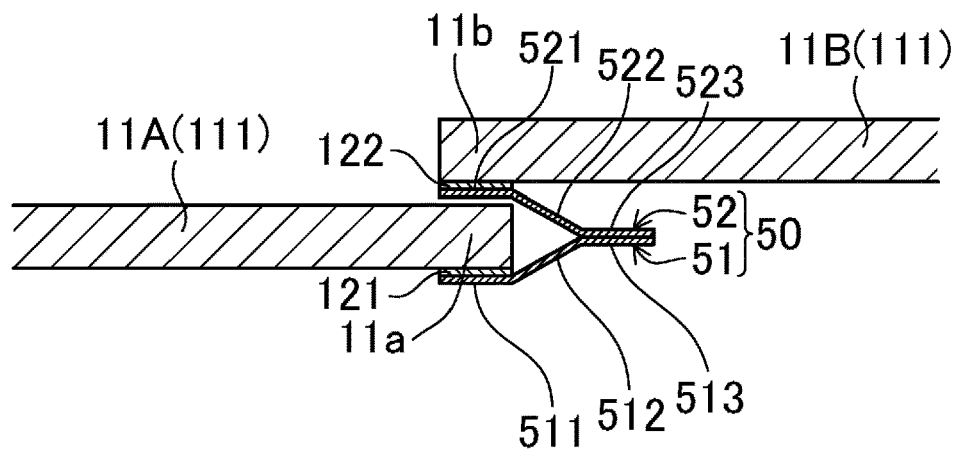
FIG. 3B is a second explanatory diagram illustrating the connection method of the solar cells using the connecting member set.
Figure 3C:
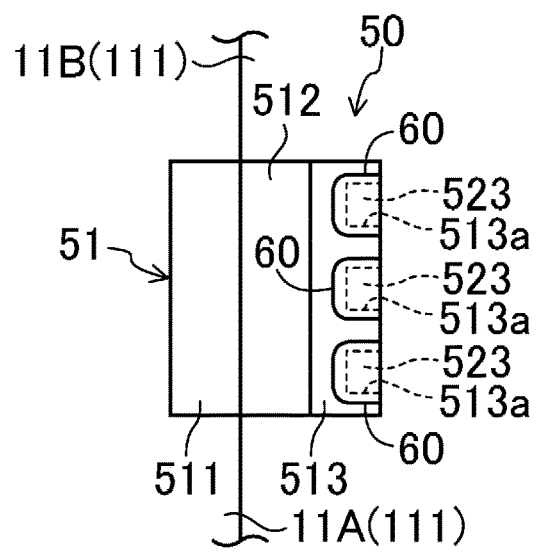
FIG. 3C is a third explanatory diagram illustrating the connection method of the solar cells using the connecting member set.

As shown in FIG. 3A, in the connecting member set 50, the first electrode connecting portion 511 of the first connecting member 51 is electrically connected to the first electrode 121 of the one solar cell 11A, and the second electrode connecting portion 521 of the second connecting member 52 is electrically connected to the second electrode 122 of the other solar cell 11B. As shown in FIG. 3B, when the second end 11b of the other solar cell 11B is arranged so as to overlap with the light receiving surface side of the first end 11a of the one solar cell 11A, without a contact of the other solar cell 11B and the second connecting member 52 with the one solar cell 11A, the first planar portion 513 of the first connecting member 51 and the second planar portion 523 of the second connecting member 52 of the connecting member set 50 overlap with the other solar cell 11B. Thus, the first planar portion 513 and the second planar portion 523 of the connecting member set 50 are layered on each other, with the first planar portion 513 being farther and the second planar portion 523 being closer with respect to the other solar cell 11B. This configuration achieves an electric connection between the first connecting member 51 and the second connecting member 52, and hence between the solar cells 11. Further, as shown in FIG. 3C, the first planar portion 513 and the second planar portion 523 of the connecting member set 50 adhere to each other, with a conductive adhesive 60 applied between an edge of each cut-out portion 513a of the first planar portion 513 and the second planar portion 523 exposed toward the first planar portion 513 from the respective cut-out portions 513a. This configuration achieves a mechanical connection between the first connecting member 51 and the second connecting member 52, and hence between the solar cells 11. Note that as long as the adhesive 60 is applied between the edge of each cut-out portion 513a and the second planar portion 523, the adhesive 60 does not necessarily have to cover the entire surface of the second planar portion 523 exposed toward the first planar portion 513 from the cut-out portions 513a.

In the connecting member set 50, the first electrode connecting portion 511 of the first connecting member 51 is electrically connected to the first electrode 121 of the one solar cell 11A, and the second electrode connecting portion 521 of the second connecting member 52 is electrically connected to the second electrode 122 of the other solar cell 11B. Further, according to the connecting member set 50, the first planar portion 513 of the first connecting member 51 and the second planar portion 523 of the second connecting member 52 are layered on each other and electrically connected with each other, and the first planar portion 513 and the second planar portion 523 adhere to each other with the conductive adhesive 60 applied between the edge of each cut-out portion 513a of the first planar portion 513 and the second planar portion 523 exposed toward the first planar portion 513 from the cut-out portions 513a. Since such a process can be easily performed, the solar cell string 10 is easily manufactured by using the connecting member set 50. Further, the first planar portion 513 and the second planar portion 523 adhere to each other in a position apart from the solar cell 11, on the back surface side of the solar cell 11. Therefore, the connection structure of the first electrode 121 and the second electrode 122 of the solar cell 11 is invisible from the light receiving surface side. This means that a solar cell string 10 with a high design characteristic is manufactured in a short time by using the connecting member set 50.

If the connecting member is configured as a single member, the solar cells need to be positioned with respect to each other, while connecting the electrodes by the connecting member. With the connecting member set 50, however, the first connecting member 51 and the second connecting member 52 are attached to the one solar cell 11A and the other solar cell 11B, respectively, and the solar cells 11 are positioned. Thereafter the first planar portion 513 and the second planar portion 523 are adhered to each other. Further, since the first planar portion 513 layered on the second planar portion 523 is visible in front of a viewer, when the solar cell 11 is viewed from the back surface side, the workability in connecting the solar cells 11 is good, which reduces positioning defects and increases the yield.

Further, in this connecting member set 50, the first electrode connecting portion 511 and the first planar portion 513 of the first connecting member 51 are formed in a planar shape, and the second electrode connecting portion 521 and the second planar portion 523 of the second connecting member 52 are formed in a planar shape. Therefore, an electrical connection between the first electrode connecting portion 511 and the first electrode 121 of the one solar cell 11A, an electrical connection between the second electrode connecting portion 521 and the second electrode 122 of the other solar cell 11B, and an electrical connection between the first planar portion 513 and the second planar portion 523 can be achieved by surface contact. From this view point too, the workability in connecting the solar cells 11 is good. In addition, the occurrence of connection failure can be reduced.

In addition, in the connecting member set 50, the first connecting member 51 is formed so as to have a level difference between the first planar portion 513 and the first electrode connecting portion 511 in the thickness direction of the one solar cell 11. Further, the second connecting member 52 is formed so as to have a level difference between the second planar portion 523 and the second electrode connecting portion 521 in the thickness direction of the other solar cell 11B. Therefore, the first planar portion 513 and the second planar portion 523 are connected to each other at a position apart from the back surface of the solar cell 11, and there is no need to pay attention to the solar cells 11. In this regard, too, the workability in connecting the solar cells 11 is good. In addition, defects such as cracks in the solar cells 11 are reduced, because stress applied to the solar cells 11 at a time of connecting the first planar portion 513 and the second planar portion 523 is low.

Figure 4:
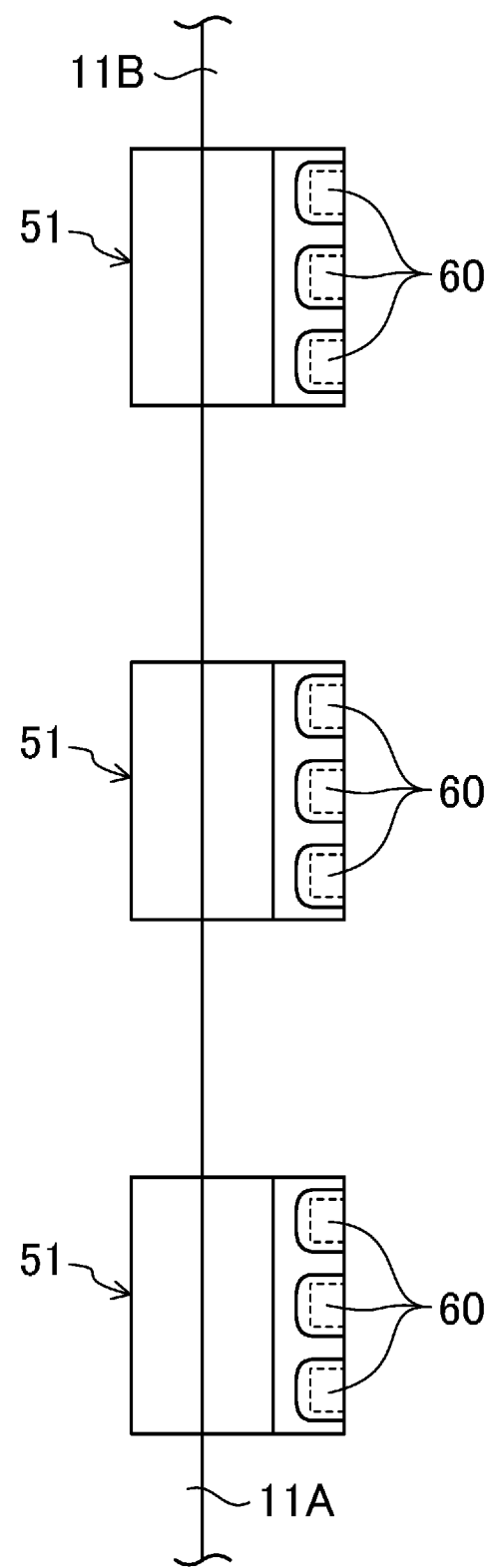
FIG. 4 is a front view of a back surface of a structure in which the solar cells are connected using a plurality of connecting member sets.

In an electrical connection between the given pair of solar cells 11A and 11B adjacent to each other, a plurality of connecting member sets 50 are arranged as shown in FIG. 4 to reduce warpage of the solar cells 11 in one preferred embodiment. Further, in one preferred embodiment, the plurality of connecting member sets 50 are arranged apart from one another.

Figure 5:
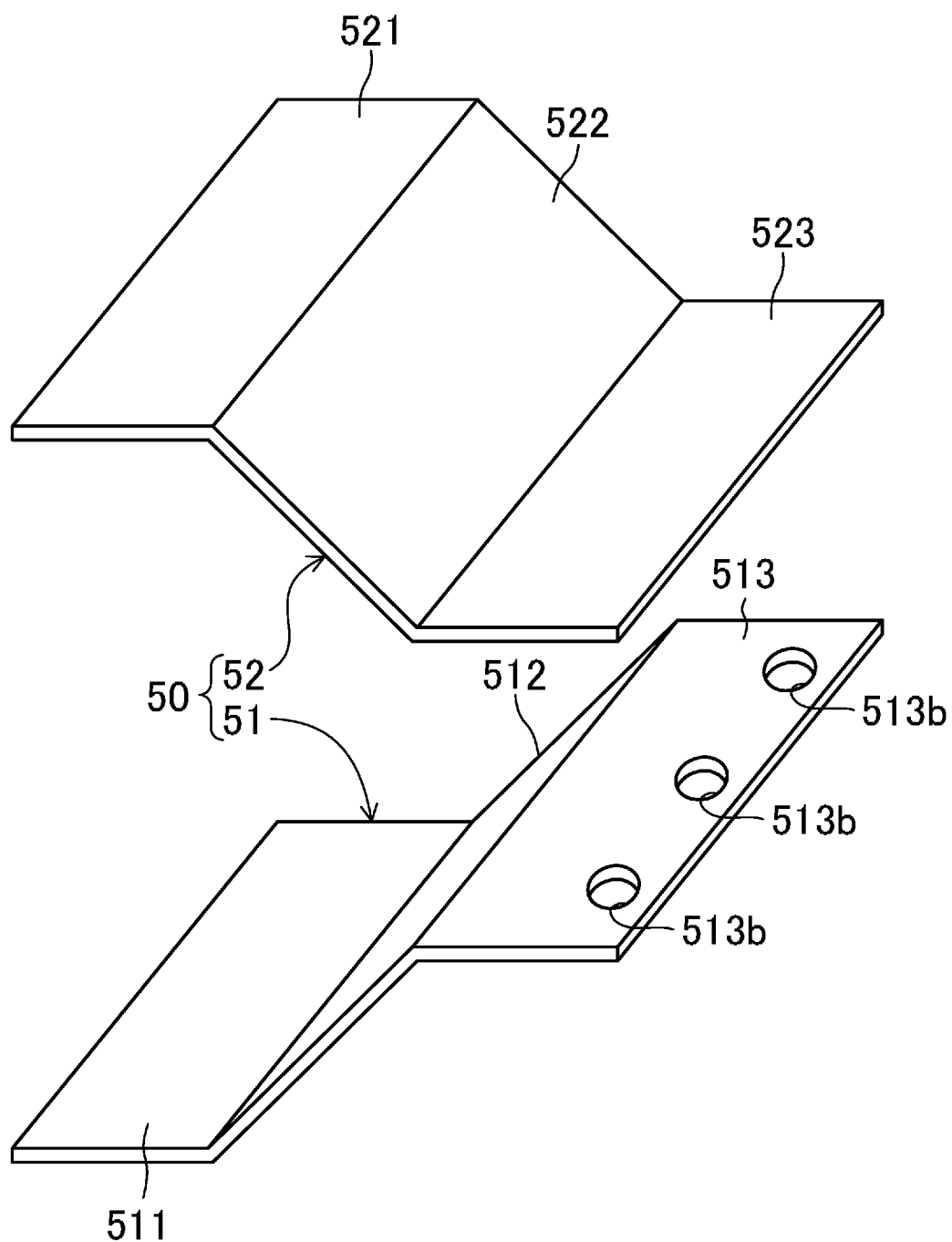
FIG. 5 is a perspective view showing a connecting member set of a first modification.

Note that the connecting member set 50 is not limited to the one shown in FIG. 2, and as illustrated in FIG. 5, the connecting member set 50 may have a plurality of circular openings 513b formed apart from one another in the first planar portion 513 of the first connecting member 51. To electrically connect the first planar portion 513 and the second planar portion 523 in this case, the first planar portion 513 and the second planar portion 523 are layered and adhered to each other with an adhesive applied between an edge of each opening 513b of the first planar portion 513 and the second planar portion 523 exposed toward the first planar portion 513 from the openings 513b.

Figure 6A:
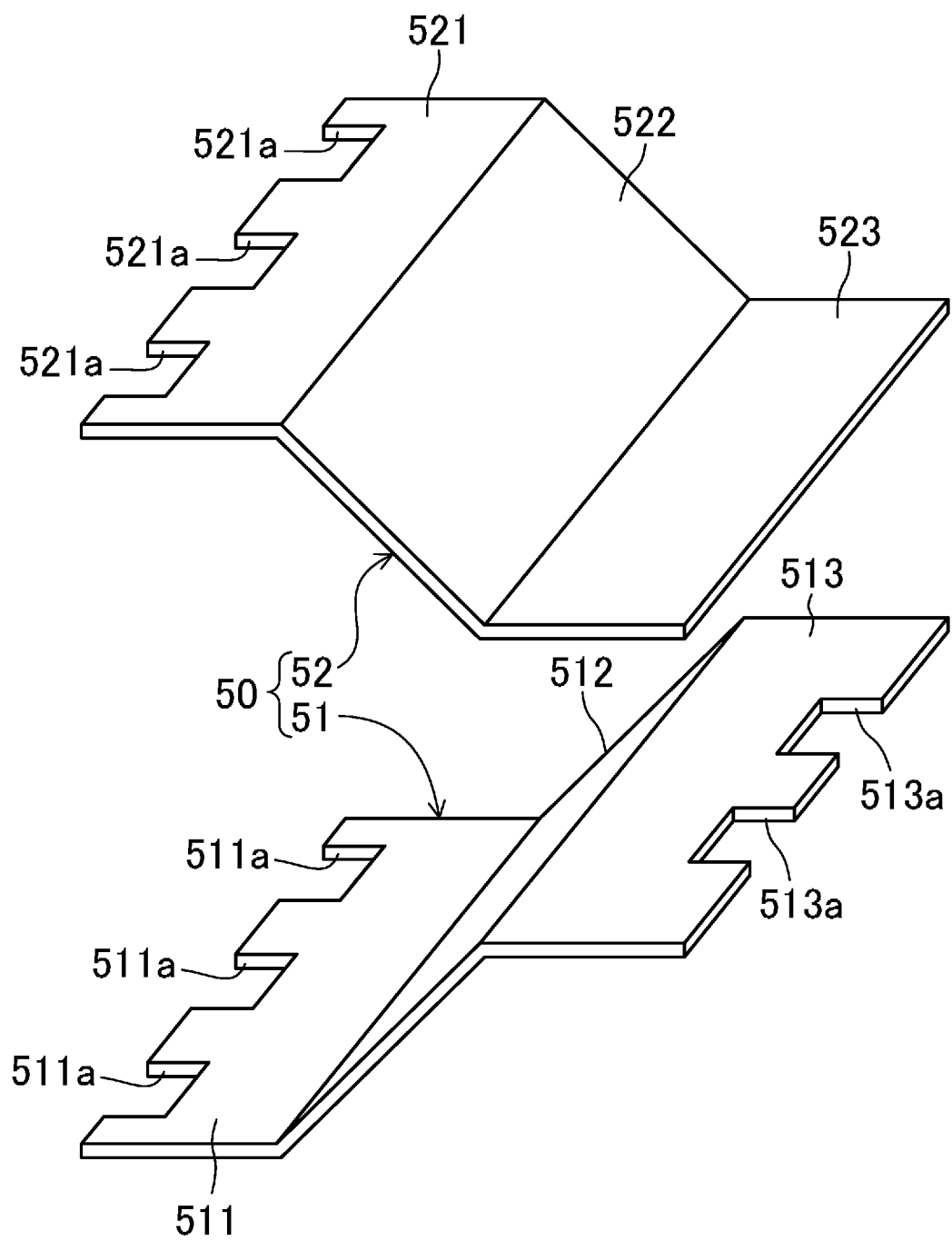
FIG. 6A is a perspective view showing a connecting member set of a second modification.
Figure 6B:
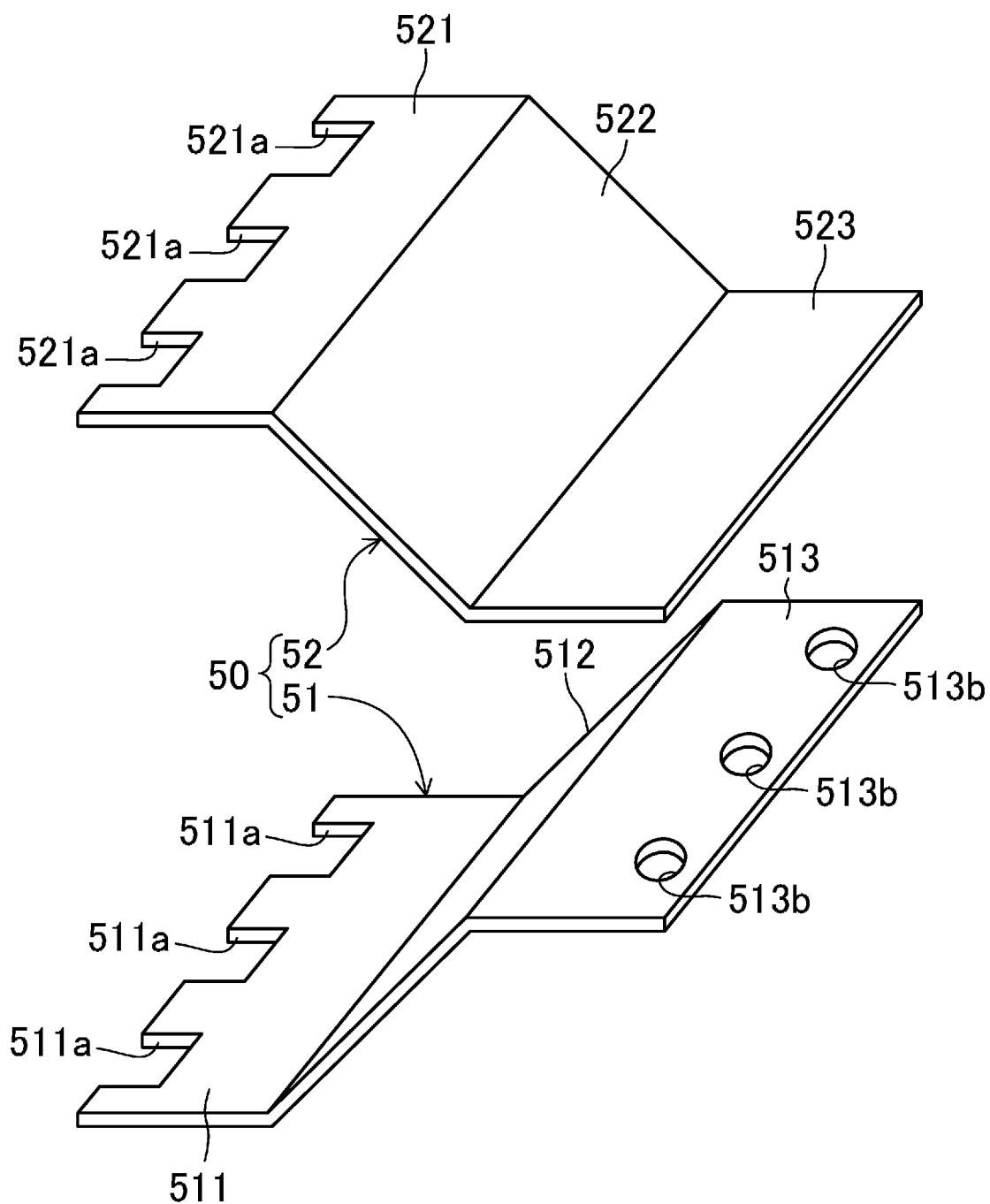
FIG. 6B is a perspective view showing a connecting member set of a third modification.

As shown in FIG. 6A and FIG. 6B, the connecting member set 50 may be such that the first electrode connecting portion 511 has cut-out portions 511a in addition to the cut-out portions 513a or the openings 513b formed in the first planar portion 513 of the first connecting member 51. Similarly, the second electrode connecting portion 521 of the second connecting member 52 also has cut-out portions 521a. In this case, an electrical connection between the first electrode connecting portion 511 and the first electrode 121 of the one solar cell 11A and an electrical connection between the second electrode connecting portion 521 and the second electrode 122 of the other solar cell 11B can be achieved with good workability similarly to the electrical connection between the first planar portion 513 and the second planar portion 523. Note that at least one of the first electrode connecting portion 511 or the second electrode connecting portion 521 may have an opening instead of or in addition to the cut-out portions.

Figure 7:
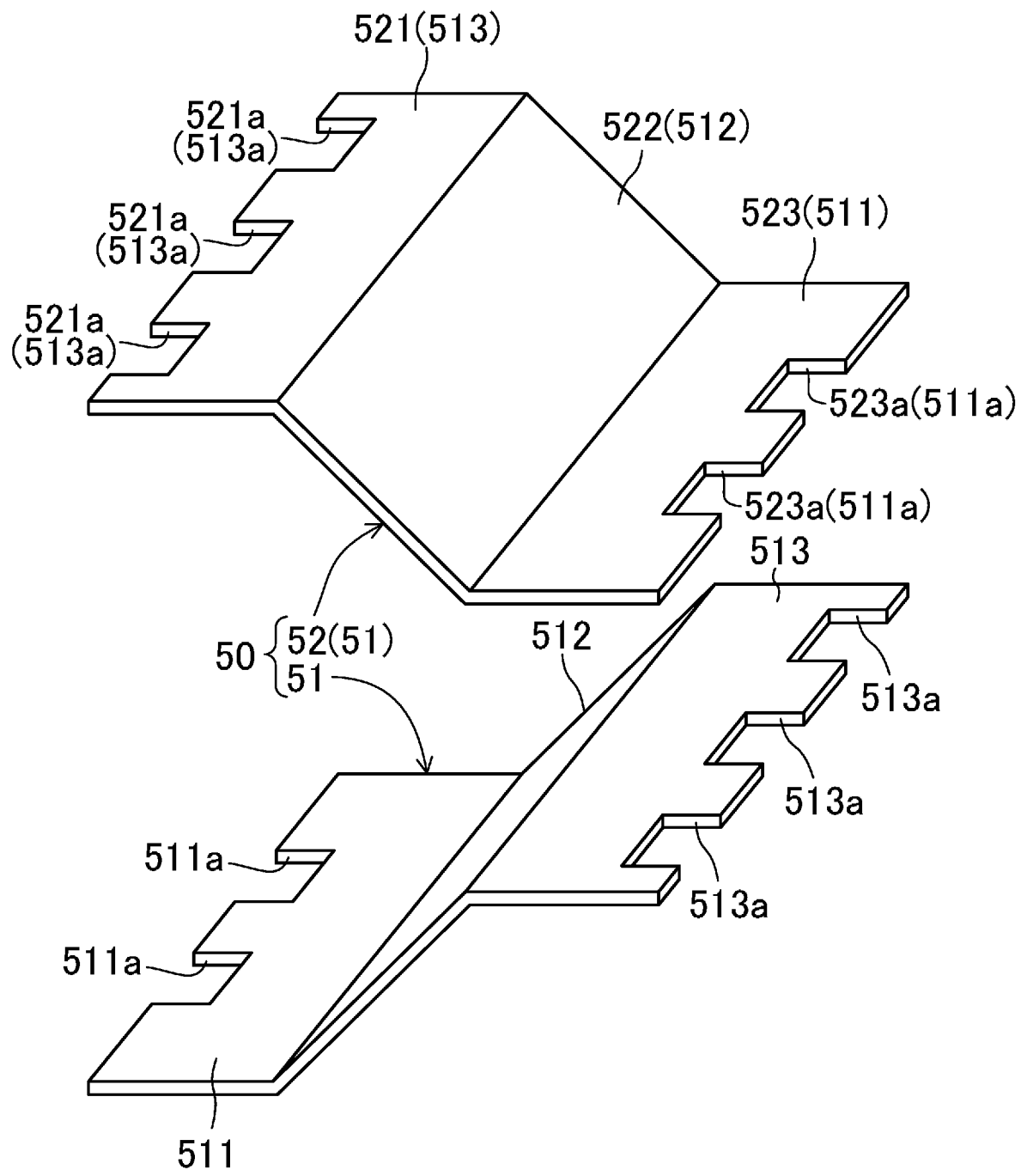
FIG. 7 is a perspective view showing a connecting member set of a fourth modification.

As shown in FIG. 7, the connecting member set 50 may be such that the first electrode connecting portion 511 and the first planar portion 513 of the first connecting member 51 have cut-out portions 511a and 513a, respectively. Positions of the cut-out portions 511a and the cut-out portions 513a along their respective sides are offset from one another. Further, the orientation of the first connecting member 51 is changed to use it as the second connecting member 52, so that the first electrode connecting portion 511 serves as the second planar portion 523 and that the first planar portion 513 serves as the second electrode connecting portion 521. In this case, even when the first planar portion 513 and the second planar portion 523 are layered on each other, their cut-out portions 513a and 511a do not overlap with one another. Thus, the first planar portion 513 and the second planar portion 523 may be adhered by applying an adhesive between the edge of each cut-out portion 513a of the first planar portion 513 and the second planar portion 523 exposed toward the first planar portion 513 from the cut-out portions 513a. Further, in this connecting member set 50, the first connecting member 51 and the second connecting member 52 are identical members. Therefore, the connecting member set 50 can be configured using members of a single type.

The solar cells 11 of the solar cell string 10 in the solar cell module M according to the embodiment is of a back-electrode type. Therefore, the solar cell string 10 and the solar cell module M using these solar cells 11 are likely to be perceived to have the same color as a whole, because no electrode is visible on the light receiving surface side, and therefore have high design characteristics. In particular, in the solar cell string 10 in which the solar cells 11 are shingling connected, and the solar cell module M including such a solar cell string 10, joints among the solar cells 11 are hardly recognizable. Therefore, the solar cell string 10 and the solar cell module M are likely to be perceived to have the same color as a whole and have higher design characteristics. Further, on the light receiving surface side of the solar cell 11, an antireflection layer or an optical adjustment layer may be stacked. The antireflection layer or the optical adjustment layer, with a suitably selected thickness and material, can control light reflection on the surface of the solar cell 11, which makes it possible to adjust the color tone of the light receiving surface side of the solar cell module M.

Examples of the solar cell 11 include a single-crystal silicon solar cell, a polycrystalline silicon solar cell, a thin film silicon solar cell, a hetero-junction solar cell, a compound-based solar cell, and an organic thin film solar cell.

Figure 8:
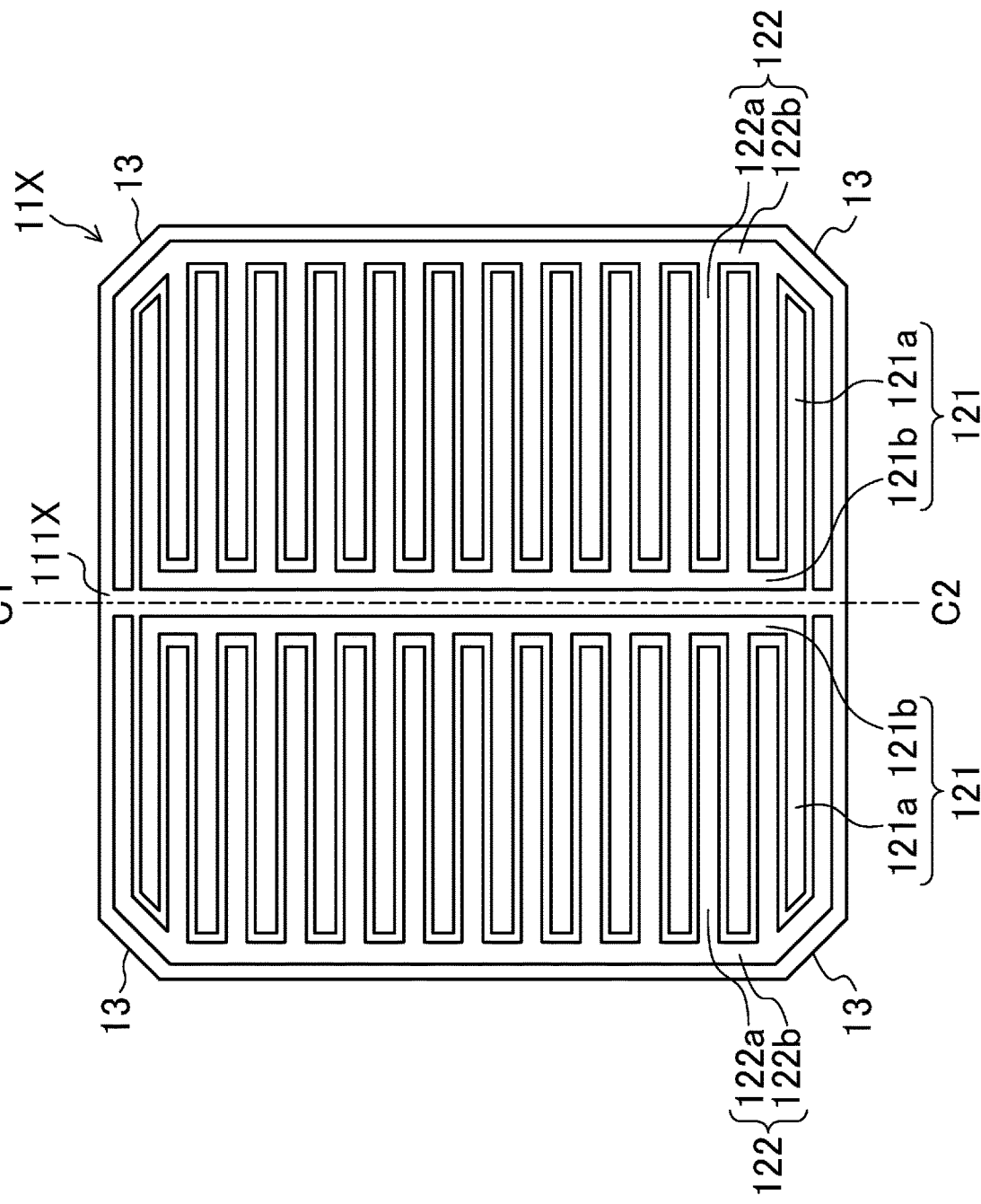
FIG. 8 is a front view of a back surface of a large-sized solar cell.
Figure 9:
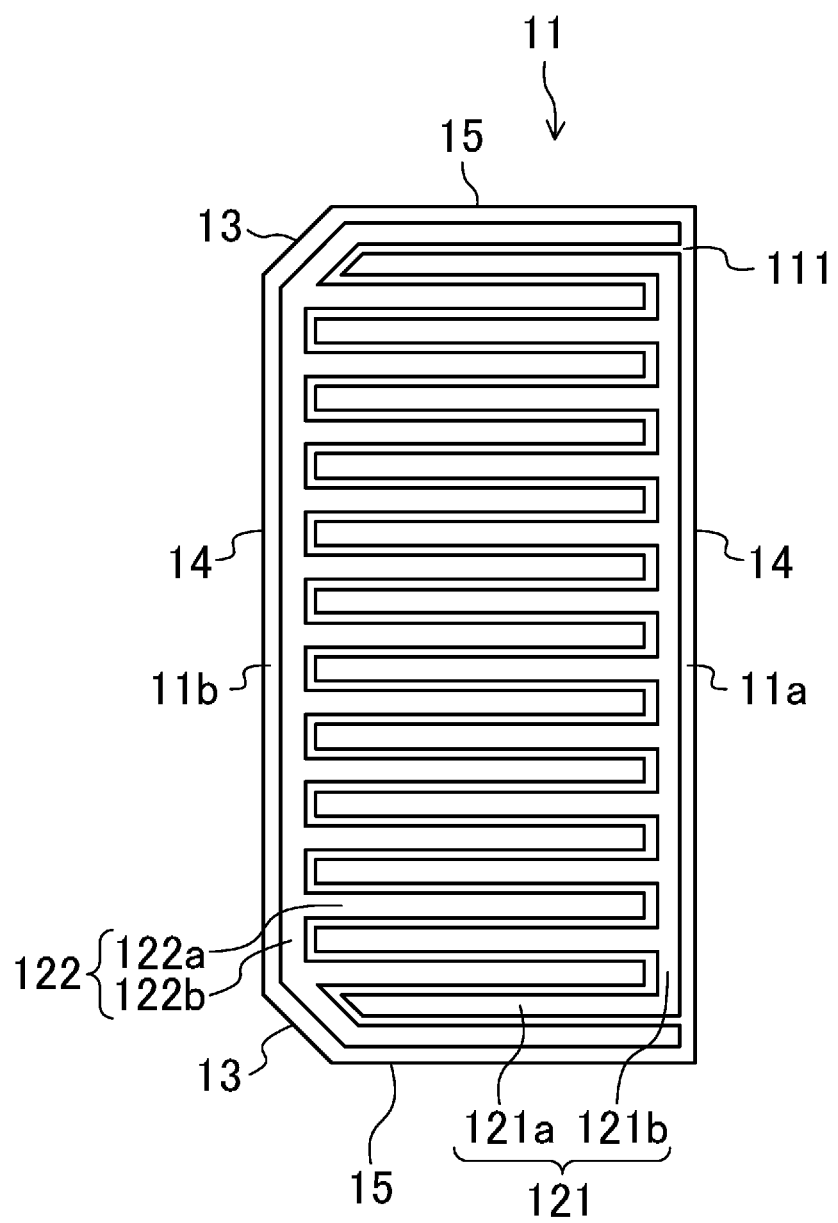
FIG. 9 is a front view of a back surface of the solar cell.

The solar cell 11 may be a divided piece obtained by dividing a large-sized solar cell 11X shown in FIG. 8. FIG. 9 shows an example of such a solar cell 11.

The large-sized solar cell 11X has a side length of, for example, approximately 20 mm or more and 200 mm or less, and is formed in a semi-square shape whose four corners each have a cut-out portion 13. The solar cell 11 is obtained by dividing the large-sized solar cell 11X into two parts by a line C1 to C2 in the middle of FIG. 8. Therefore, the solar cell 11 is formed with long sides 14 of, for example, approximately 20 mm or more and 200 mm or less in length, and with short sides 15 of, for example, 10 mm or more and 100 mm or less in length (approximately a half of the long side), and the cut-out portions 13 are formed at both ends (i.e., corners) of one of the long sides 14. In the case in which the solar cells 11 obtained by dividing such a large-sized solar cell 11X are used for forming the solar cell module M, the larger number of divided solar cells 11 are mounted in a limited mounting area, compared to the number of large-sized solar cells 11X. That is, the amount of mounting the solar cells (power generation area) in the solar cell module M is enlarged. Therefore, the solar cell module M with the divided solar cells 11 mounted thereon can increase the amount of power generation compared to a solar cell module M with the large-sized solar cells 11X mounted thereon.

The large-sized solar cell 11X has a back surface that corresponds to a surface of a large-sized semiconductor substrate 111X. The surface of the large-sized semiconductor substrate 111X is divided into areas that will be two semiconductor substrates 111 where solar cells 11 are to be built. Each of the semiconductor substrates 111 includes a first conductivity type area which is one of an n-type area or a p-type area and a second conductivity type area which is the other one of the n-type area or the p-type area. The first and second conductivity type areas are formed through semiconductor stacking means. Using a known method, the first electrode 121 is arranged on the first conductivity type area and the second electrode 122 is arranged on the second conductivity type area. As the large-sized semiconductor substrate 111X, for example, a single crystal silicon substrate or polycrystalline silicon substrate is used. To form the first conductivity type area and the second conductivity type area, a technology to form a doping area in the large-sized semiconductor substrate 111X and a technology to form a semiconductor thin film, such as an amorphous silicon thin film, on the large-sized semiconductor substrate 111X are adopted. In a case of arranging an n-type or p-type conductive semiconductor thin film on the large-sized semiconductor substrate 111X, an intrinsic semiconductor thin film, such as an intrinsic amorphous silicon thin film, is arranged between the large-sized semiconductor substrate 111X and the conductive semiconductor thin film. Doing so produces a passivation effect on the surface of the large-sized semiconductor substrate 111X.

In one preferred embodiment, the first electrode 121 and the second electrode 122 are patterned in a comb-like shape so that the comb-teeth mesh with each other. More specifically, the first electrode 121 is formed in a comb-like shape having a plurality of first electrode finger portions 121a and a single first electrode busbar portion 121b. The plurality of first electrode finger portions 121a each extend parallel to the short sides 15 of the solar cell 11, and are arranged apart from one another in a direction in which the long sides 14 of the solar cell 11 extend. The first electrode busbar portion 121b is arranged so as to extend along the long side 14 having no cut-out portions 13 of the solar cell 11, that is, along a first end 11a, so as to connect the ends of the first electrode finger portions 121a on that long side 14. The second electrode 122 is also formed in a comb-like shape having a plurality of second electrode finger portions 122a and a single second electrode busbar portion 122b. The plurality of second electrode finger portions 122a each extend parallel to the short sides 15 of the solar cell 11, and are arranged apart from one another in a direction in which the long sides 14 of the solar cell 11 extend. The second electrode busbar portion 122b is arranged so as to extend along the long side 14 having the cut-out portions 13 of the solar cell 11, that is, along a second end 11b, so as to connect the ends of the second electrode finger portions 122a on that long side 14.

The first electrode 121 and the second electrode 122 are arranged so that the first electrode finger portions 121a and the second electrode finger portions 122a are alternately arranged along the direction in which the long sides 14 of the solar cell 11 extend. In this case, the lengths of the first electrode finger portions 121a and the second electrode finger portions 122a are approximately a half of the lengths of the first electrode busbar portion 121b and the second electrode busbar portion 122b. Therefore, a carrier collection loss due to the line resistance of the first electrode finger portions 121a and the second electrode finger portions 122a is reduced. Further, in one preferred embodiment, the first electrode connecting portion 511 of the first connecting member 51 of the connecting member set 50 is electrically connected to the first electrode busbar portion 121b of the first electrode 121 extending along the first end 11a of the solar cell 11, and the second electrode connecting portion 521 of the second connecting member 52 is electrically connected to the second electrode busbar portion 122b of the second electrode 122 extending along the second end 11b of the solar cell 11.

In one preferred embodiment, the large-sized solar cell 11X is designed so as to yield two identical solar cells 11 by dividing the same. Therefore, in one preferred embodiment, the first conductivity type area and the second conductivity type area are patterned on the large-sized semiconductor substrate 111X in such a manner that these areas are bilaterally symmetrical about the center of the substrate. The identical solar cells 11 obtained from the large-sized solar cell 11X as described above each have a divided end that helps making handling of each divided solar cell 11 easier, which, for example, improves workability at a time of forming the solar cell string 10. In particular, in the solar cell 11 shown in FIG. 9 obtained by dividing the large-sized solar cell 11X formed in a semi-square shape as shown in FIG. 8 into two pieces, the first electrode busbar portion 121b and the second electrode busbar portion 122b are easily distinguishable from each other, that is, the one extending along the long side 14 without the cut-out portion 13 is the first electrode busbar portion 121b and the one extending along the long side 14 with the cut-out portions 13 is the second electrode busbar portion 122b. This allows easier handling of the divided solar cells 11.

An example of a method for dividing the large-sized solar cell 11X is a laser machining. In this case, a laser beam is applied along a division line of the large-sized solar cell 11X to form a groove which is easily breakable, along which the large-sized solar cell 11X can be divided by bending into two pieces. This groove may be formed on the light receiving surface side or on the back surface side.

Meanwhile, at a time of manufacturing the large-sized solar cell 11X, there is a high possibility that the film thickness of the semiconductor thin film at the outer peripheral edges becomes uneven. Further, the surfaces of the outer peripheral edges of the large-sized solar cell 11X are likely to be subjected to abrasion or a scratch during handling at the time of manufacturing. Therefore, in the solar cell 11 obtained from the large-sized solar cell 11X, the power generation efficiency tends to be lower at the portions corresponding to the outer peripheral edges of the large-sized solar cell 11X, as compared to the portion corresponding to the center of the large-sized solar cell 11X, due to a greater power generation loss caused by carrier recombination or the like.

Figure 10:
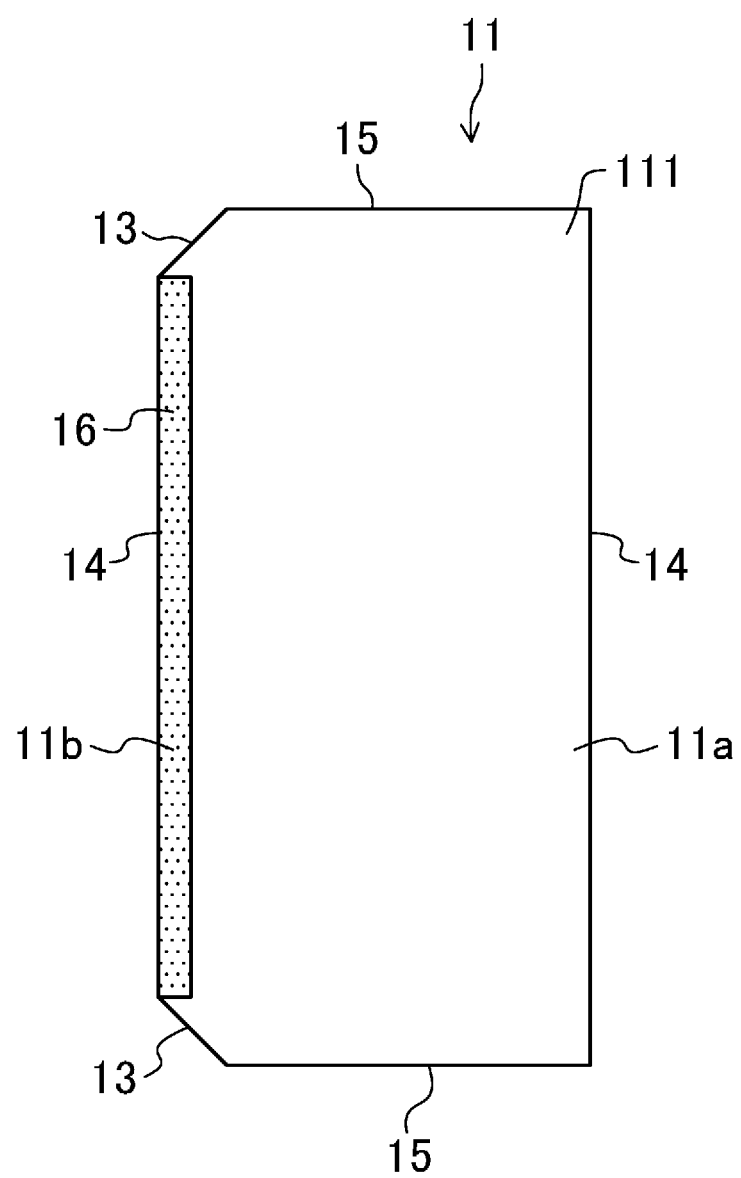
FIG. 10 is a front view of a light receiving surface of the solar cell.

In view of the above problem, as shown in FIG. 10, the solar cell 11 may have a reflector 16 arranged at least a portion on the light receiving surface side, which corresponds to the outer peripheral edges of the large-sized solar cell 11X. As shown in FIG. 10, the reflector 16 may be arranged only along the long side 14 of the solar cell 11 among the portions on the light receiving surface side corresponding to the outer peripheral edges of the large-sized solar cell 11X. Alternatively, the reflector 16 may be either arranged along both the long and short sides 14 and 15 of the solar cell 11, or arranged only along the short sides 15 of the solar cell 11.

With the reflector 16 in the portion on the light receiving surface side corresponding to the outer peripheral edge of the large-sized solar cell 11X, light applied to the area of the reflector 16 is reflected on the reflector 16 and is not directly incident on the solar cell 11. The light reflected on the reflector 16 is reflected again on another member and the like, and is incident on the solar cell 11 from an area where the reflector 16 is not arranged, thus contributing generation of power. The reflected light does not necessarily have to be incident on the solar cell 11 having the reflector 16 that has reflected the light, and may be incident on another solar cell 11 in the solar cell string 10. This reduces power generation loss caused by light incident on a portion with a low power generation efficiency, which corresponds to the outer peripheral edges of the large-sized solar cell 11X, and achieves a high-power output by causing the light having been reflected on the reflector 16 to be incident on an area with a high power generating efficiency (a normal area in the center of the plane of the cell).

The material for forming the reflector 16 is not particularly limited as long as the material can reflect light, but is preferably a metal such as copper, aluminum, silver, gold, tin, or an alloy of these, for the reason that these materials have high reflectance. As long as the reflector 16 has light-reflectivity on its light receiving surface side, the reflector 16 may be a reflecting member having a reflective layer of a metal or the like on a surface of a resin material. The reflector 16 may be arranged either by printing a metal layer or the like, or attaching a reflective member.

Figure 11A:
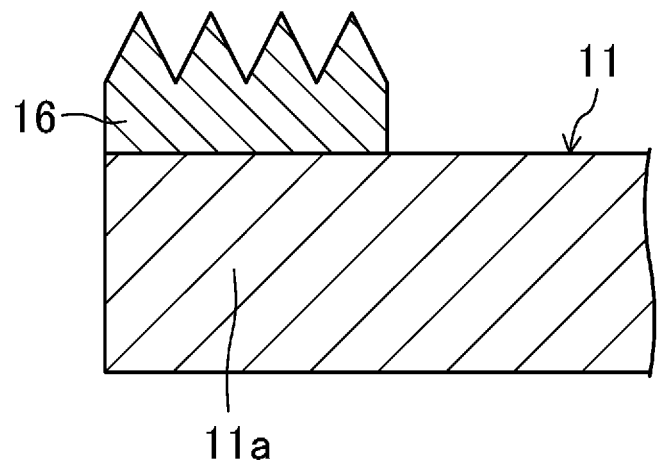
FIG. 11A is a cross-sectional view of a reflector in which ridges having a triangular cross-section and extending in a length direction are aligned in a width direction.
Figure 11B:
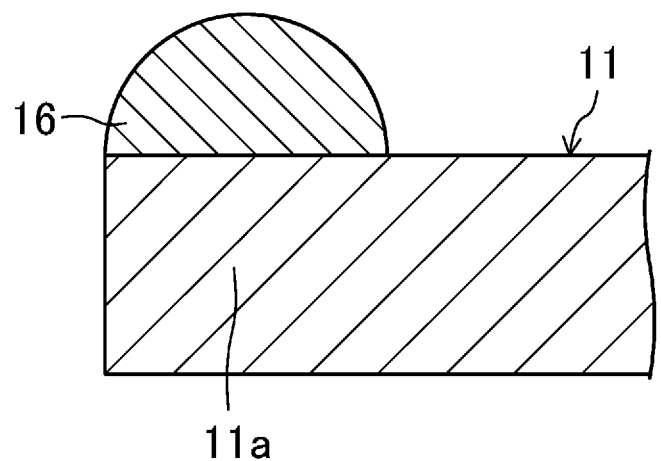
FIG. 11B is a cross-sectional view of a reflector with a ridge having a semicircular cross-section and extending in the length direction.

To reflect light in an oblique direction to increase the amount of reflected light incident on other portions, the reflector 16 may have unevenness on its surface on the light receiving surface side. For the same reason, the reflector 16 may have a surface inclined with respect to the light receiving surface of the solar cell 11. For example, as shown in FIG. 11A, ridges each having a triangular cross-section and extending in a length direction (the direction in which the short sides 15 extend) may be aligned in a width direction. The inclination angles of the slopes of the ridges of the reflector 16 which each have a triangular cross-section are set to a predetermined range so that light reflected on the reflector 16 is incident on the light receiving surface side protective member 30 at an increased incident angle. This increases the reflectance at the interface between the light receiving surface side protective member 30 and the air, and causes the light reflected on the reflector 16 to be reflected on the light receiving surface side protective member 30 and be incident on the solar cell 11. Thus, the amount of light incident is increased and the power generation efficiency is improved. Further, the reflector 16 may have a curved surface on its light receiving surface side and may have, for example, a ridge having a semicircular cross-section as illustrated in FIG. 11B.

The material of the encapsulant layer 20 has a high light transmittance and a high resistance to ultraviolet radiation in one preferred embodiment. It is also preferred that the material of the encapsulant layer 20 be highly adhesive to the solar cells 11 included in the solar cell string 10, the light receiving surface side protective member 30, and the back surface side protective member 40. The material for forming the encapsulant layer 20 may be, for example, a light-transmissive resin such as an ethylene/vinyl acetate copolymer (EVA), an ethylene/α-olefin copolymer, ethylene/vinyl acetate/triallyl isocyanurate (EVAT), polyvinyl butyrate (PVB), an acrylic resin, a urethane resin, or a silicone resin. The encapsulant layer 20 may be formed of a single material, or different materials may be used for the portion on the light receiving surface side and for the portion on the back surface side of the solar cell string 10. The material of the encapsulant layer 20 may contain an additive such as an organic peroxide, a silane coupling agent, an ultraviolet absorber, a wavelength conversion additive, a crosslinking aid, a heat stabilizer, and a light stabilizer.

The material of the light receiving surface side protective member 30 has a high light transmittance and a high resistance to ultraviolet radiation in one preferred embodiment. Examples of the material for the light receiving surface side protective member 30 include glass, a transparent resin such as an acrylic resin and a polycarbonate resin, or the like. Unevenness may be formed on the surface on the light receiving surface side of the light receiving surface side protective member 30. The surface on the light receiving surface side of the light receiving surface side protective member 30 may be covered with an antireflection coating layer. Such an antireflection coating layer, when arranged, reduces reflection of light and guides more light to the solar cell 11.

The material of the back surface side protective member 40 has high water blocking properties so as to restrict entry of water and the like in one preferred embodiment. Examples of the material for the back surface side protective member 40 include polyethylene terephthalate (PET), an olefin resin such as polyethylene (PE), a fluorine-containing resin, a silicone-containing resin and the like. The back surface side protective member 40 may have light reflectivity. The back surface side protective member 40 having the light reflectivity has a metallic color or a white color in one preferred embodiment, and may be formed of, for example, a white resin film or a lamination including a metal foil such as aluminum sandwiched between resin films. Further, the back surface side protective member 40 may have light absorbency. The back surface side protective member 40 having light absorbency is made of a material with a black exterior appearance, such as a black resin layer or the like, in one preferred embodiment. The back surface side protective member 40 of black color has an exterior appearance resembling the solar cell string 10 including the plurality of solar cells 11. Therefore, the solar cell module M will have high design characteristics with its entire surface uniformly black. Note that the back surface side protective member 40 may have light-transparency.

The solar cell module M of the present embodiment is manufactured as follows. That is, the plurality of solar cells 11 are connected and linked one after another by using the connecting member set 50 to make the solar cell string 10. Then, a sheet material for forming the light receiving surface side protective member 30, a sheet material for forming the encapsulant layer 20 on the light receiving surface side, the solar cell string 10, a sheet material for forming the encapsulant layer 20 on the back surface side, and the back surface side protective member 40 are stacked in this order. This stack is heated and pressurized at a predetermined temperature and a predetermined pressure, by using a laminator or the like which performs evacuation.

Note that the above embodiment deals with a case where the connecting member set 50 is used to shingling-connect the plurality of solar cells 11 to form the solar cell string 10. However, this is a non-limiting example and the connecting member set may be used to connect the solar cells arranged apart from or abutted against each other to form a solar cell string.

Figure 12:
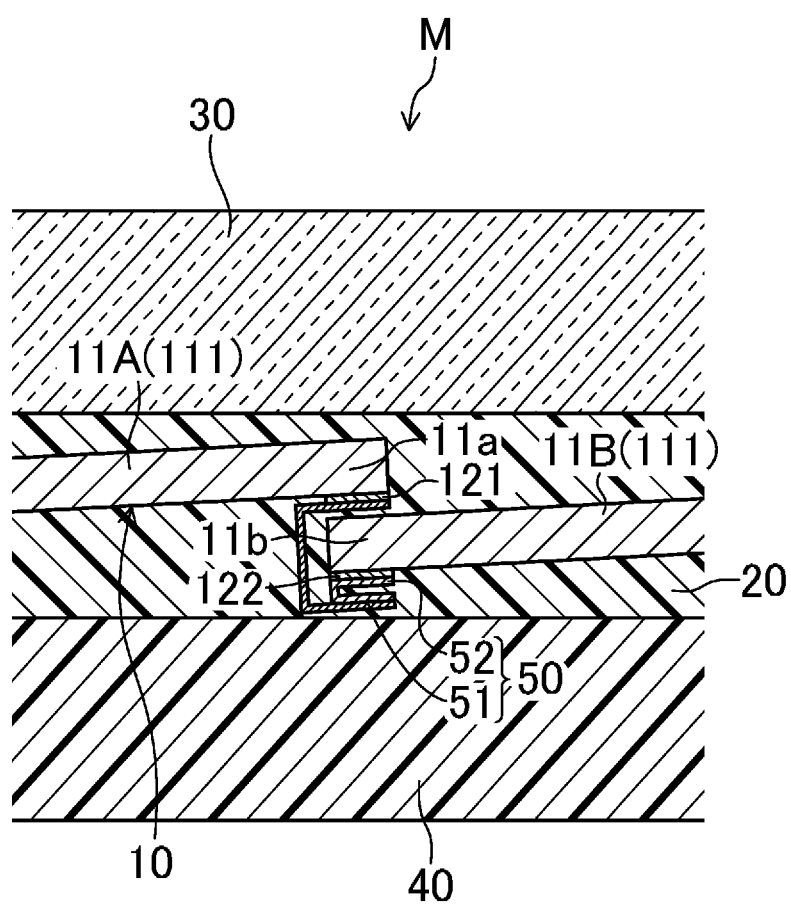
FIG. 12 is a cross-sectional view showing a portion of a modification of a solar cell module according to the embodiment.

In the above embodiment, the second end 11b of the other solar cell 11B to which the second connecting member 52 is attached is arranged to overlap with the light receiving surface side of the first end 11a of the one solar cell 11A to which the first connecting member 51 is attached. However, this is a non-limiting example. As shown in FIG. 12, the first end 11a of the one solar cell 11A to which the first connecting member 51 is attached may be arranged to overlap with the light receiving surface side of the second end 11b of the other solar cell 11B to which the second connecting member 52 is attached.

In the above embodiment, the first planar portion 513 of the first connecting member 51 has the cut-out portions 513a or the openings 513b. However, this is a non-limiting example and the first planar portion 513 may have both the cut-out portions and the openings.

In the above embodiment, the first connecting member 51 has a level difference between the first planar portion 513 and the first electrode connecting portion 511, and the second connecting member 52 has a level difference between the second planar portion 523 and the second electrode connecting portion 521. However, these are non-limiting examples, and at least one of the first connecting member or the second connecting member may be formed as a flat plate without a level difference.

In the above embodiment, the first planar portion 513 of the first connecting member 51 does not overlap with the one solar cell 11A, and the second planar portion 523 of the second connecting member 52 overlaps with the other solar cell 11B. However, these are non-limiting examples, and the first planar portion of the first connecting member may overlap with the one solar cell, and the second planar portion of the second connecting member does not have to overlap with the other solar cell.

In the above embodiment, a plurality of connecting member sets are used for the pair of solar cells 11A and 11B. However, this is a non-limiting example, and a single long connecting member set may be used to connect a pair of solar cells.

EXAMPLES (Solar Cell Module)
The solar cell modules of the following Examples 1 to 3 and Comparative Examples 1 and 2 were manufactured.

Example 1

A plurality of solar cells similar to one shown in FIG. 9 were prepared by dividing a large-sized solar cell similar to one shown in FIG. 8 into two pieces. The large-sized solar cell had a first electrode which is an n-type electrode and a second electrode which is a p-type electrode. For the plurality of solar cells, connecting member sets similar to those shown in FIG. 6A were used, as described hereinabove, to manufacture a solar cell string. That is, as shown in FIG. 1A and FIG. 1B, a given pair of solar cells (i.e., one solar cell and the other solar cell) adjacent to each other out of the plurality of solar cells were shingling-connected to each other by placing, so as to overlap with the light receiving surface side of a first end of the one solar cell, a second end of the other solar cell. The first connecting member and the second connecting member of the connecting member set were each formed of a copper foil of 35 μm in thickness. To connect the pair of solar cells, four connecting member sets were arranged apart from one another. As the adhesive, a solder paste was used.

Then, a sheet material for forming the light receiving surface side protective member, a sheet material for forming the encapsulant layer on the light receiving surface side, the solar cell string manufactured, a sheet material for forming the encapsulant layer on the back surface side, and the back surface side protective member were stacked in this order. This stack was pressurized by using a laminator which performs evacuation, with the temperature set at 140° C., to manufacture a solar cell module of Example 1. For the sheet material for forming the light receiving surface side protective member, highly transparent cover glass for a solar cell made of 3 mm thick non-tempered glass was used. For the sheet material for forming the encapsulant layers on the light receiving surface side and on the back surface side, an EVA sheet not containing ultraviolet absorber was used. For the sheet material for forming the back surface side protective member, a triple-layered sheet having black PET/aluminum foil/transparent PET was used.

Example 2

By using the connecting member sets similar to one shown in FIG. 6B, a solar cell module of Example 2 was manufactured in a similar manner as Example 1, except that the first connecting member and the second connecting member are each made of copper foil of 18 μm in thickness.

Example 3

A solar cell module of Example 3 was manufactured in a similar manner as Example 1, except that a reflector similar to one shown in FIG. 10 which is made of silver-plated copper foil of 2 mm in width was adhered with an adhesive to the light receiving surface side of the second end of the other solar cell. The reflector was arranged at a portion corresponding to the outer peripheral edge of the large-sized solar cell.

Comparative Example 1

A connecting member of a single piece was formed by bending a copper foil piece so that its cross-section has a V-shape. The copper foil piece used had a thickness of 35 μm, and had no cut-out portions or openings. Then, a solar cell module of Comparative Example 1 was manufactured in a similar manner as Example 1, except that four of the connecting members were arranged apart from one another so as to cover the first end of the one solar cell, thereby connecting the n-type electrode on the back surface of the one solar cell and the p-type electrode on the back surface of the other solar cell.

Comparative Example 2

A solar cell module of Comparative Example 2 was manufactured in a similar manner as Example 1, except that each connecting member set used included a first connecting member whose first planar portion had no cut-out portions.
(Test Evaluation Method)
<Connection Workability>
For the solar cells of Examples 1 to 3 and Comparative Examples 1 and 2, the workability in connecting the solar cells was rated A if no hindrance was recognized during the work, and rated B if there was a difficulty in positioning the solar cells during the work.
<Warpage of Solar Cell>
For the solar cells of Examples 1 to 3 and Comparative Examples 1 and 2 after being connected, the warpage was visually evaluated. Those with no or minor warpage were rated A, and those with significant warpage were rated B.
(Test Evaluation Result)
The test evaluation results are shown in Table 1.

TABLE 1

|  | Example 1 | Example 2 | Example 3 | Comparative Example 1 | Comparative Example 2 |
| --- | --- | --- | --- | --- | --- |
| Connection Workability | A | A | A | B | A |
| Solar Cell Warpage | A | A | A | A | B |

Table 1 shows that Examples 1 to 3 using the connecting member set including the first connecting member whose first planar portion has cut-out portions have better connection workability than the Comparative Example 1 using a connecting member of a single piece.

Further, while no warpage was recognized in the solar cells of Examples 1 to 3, the warpage was recognized in the solar cells of Comparative Example 2 using the connecting member set including the first connecting member whose first planar portion has no cut-out portions. This is believed to be attributed to the following reason. That is, Examples 1 to 3 each required a short heating time to adhere the first planar portion of the first connecting member to the second planar portion of the second connecting member, by applying an adhesive between an edge of each cut-out portion or opening of the first planar portion of the first connecting member and the second planar portion of the second connecting member exposed toward the first planar portion from the cut-out portions or the openings. On the other hand, Comparative Example 2 required a long heating time to adhere the first planar portion of the first connecting member to the second planar portion of the second connecting member, using a solder paste provided therebetween.

The embodiments have been described above as example techniques of the present disclosure, in which the attached drawings and the detailed description are provided. As such, elements illustrated in the attached drawings or the detailed description may include not only essential elements for solving the problem, but also non-essential elements for solving the problem in order to illustrate such techniques. Thus, the mere fact that those non-essential elements are shown in the attached drawings or the detailed description should not be interpreted as requiring that such elements be essential. Since the embodiments described above are intended to illustrate the techniques in the present disclosure, it is intended by the following claims to claim any and all modifications, substitutions, additions, and omissions that fall within the proper scope of the claims appropriately interpreted in accordance with the doctrine of equivalents and other applicable judicial doctrines.

What is claimed is:

1. A connecting member set for electrically connecting a pair of solar cells each having a bottom surface on which is disposed a first electrode and a second electrode, the first electrode being one of an n-type electrode or a p-type electrode, the second electrode being the other one of the n-type electrode or the p-type electrode, the connecting member set comprising:
    a first connecting member having a first electrode connecting portion that is electrically connected to the first electrode of a first solar cell of the pair of solar cells; and
    a second connecting member having a second electrode connecting portion that is electrically connected to the second electrode of a second solar cell of the pair of solar cells,
    wherein
    the first connecting member and the second connecting member have a first planar portion and a second planar portion, respectively, the first planar portion and the second planar portion are layered on each other and electrically connected with each other,
    the first planar portion of the first connecting member has at least one of a cut-out portion or an opening through which the second planar portion of the second connecting member is exposed toward the first planar portion when the first planar portion and the second planar portion are layered on each other,
    the first electrode connecting portion and the second electrode connecting portion overlap each other and overlap a portion of the first solar cell and a portion of the second solar cell as viewed in a direction normal to the bottom surfaces of the first and second solar cells to which the first and second electrodes are attached, and
    the first connecting member and the second connecting member respectively extend to the first and second planar portions that are at distal ends of the first and second connecting members, and the first and second planar portions overlap another portion of the second solar cell as viewed in the direction normal to the bottom surface of the second solar cell.

2. The connecting member set of claim 1, wherein the first connecting member and the second connecting member are formed in different shapes.

3. The connecting member set of claim 1, wherein the first connecting member has a level difference between the first planar portion and the first electrode connecting portion in a thickness direction of the first solar cell.

4. The connecting member set of claim 1, wherein the second connecting member has a level difference between the second planar portion and the second electrode connecting portion in a thickness direction of the second solar cell.

5. The connecting member set of claim 1, wherein the first connecting member is arranged so that the first planar portion does not overlap with the first solar cell, and
the second connecting member is arranged so that the second planar portion overlaps with the second solar cell.

6. The connecting member set of claim 1, wherein the first connecting member and the second connecting member are each a bent product of a metal foil.

7. The connecting member set of claim 1, wherein the first electrode connecting portion of the first connecting member and the second electrode connecting portion of the second connecting member have at least one of a cut-out portion or an opening.

8. The connecting member set of claim 1, wherein a respective reflector is arranged in at least a portion of an area on a top surface corresponding to an outer peripheral edge of each of the solar cells.

9. The connecting member set of claim 1, wherein the first connecting member includes a first link that extends between the first electrode connecting portion and the first planar portion,
the second connecting member includes a second link that extends between the second electrode connecting portion and the second planar portion, and
the first and second links converge toward each other such that the first and second planar portions contact each other at a location that is spaced from the solar cells.

10. A solar cell string having a plurality of the pairs of solar cells electrically connected and linked one after another by using the connecting member set of claim 1, wherein
the first planar portion and the second planar portion are adhered to each other with an adhesive applied between an edge of the at least one of the cut-out portion or the opening formed in the first planar portion and the second planar portion exposed toward the first planar portion from the at least one of the cut-out portion or the opening.

11. The solar cell string of claim 10, wherein
each of the pairs of solar cells has a first end and a second end extended parallel to each other, and
a given pair of solar cells adjacent to each other out of the plurality of solar cells are connected to each other by placing the first end of the one of the pair of solar cells so as to overlap with a light receiving surface side of the second end of the other one of the pair of solar cells, or the second end of the other one of the pair of solar cells so as to overlap with a light receiving surface side of the first end of the one of the pair of solar cells.

12. The solar cell string of claim 10, wherein
the connecting member set includes a plurality of connecting member sets, the plurality of connecting member sets being used to electrically connect a given pair of solar cells adjacent to each other out of the plurality of solar cells.

13. The solar cell string of claim 10, wherein
each of the plurality of solar cells is a piece obtained by dividing a larger solar cell.

14. A solar cell module comprising the solar cell string of claim 10.

* * * * *